United States Patent [19]

Van Vliet

[11] 4,375,601
[45] Mar. 1, 1983

[54] SIGNAL STABILITY RECOGNITION

[75] Inventor: James G. Van Vliet, La Habra, Calif.

[73] Assignee: Beckman Instruments, Inc., Fullerton, Calif.

[21] Appl. No.: 166,521

[22] Filed: Jul. 7, 1980

[51] Int. Cl.³ .................. H03K 17/28; H03K 5/26
[52] U.S. Cl. ............................ 307/592; 307/200 A; 307/517; 307/359; 328/129.1
[58] Field of Search ............ 307/247 A, 231, 592, 307/517, 200 A, 358, 359; 235/92 EC; 324/99 D; 340/791; 328/129

[56] References Cited

U.S. PATENT DOCUMENTS

| | | | |
|---|---|---|---|
| 3,621,391 | 11/1971 | Miller | 324/99 D |
| 3,735,387 | 5/1973 | Miller | 340/791 |
| 3,845,282 | 10/1974 | Mattson | 235/92 EA |
| 3,860,802 | 1/1975 | Knothe et al. | 235/151.33 |
| 3,908,116 | 9/1975 | Bjornsen | 235/92 EC |
| 3,939,333 | 2/1976 | Keech | 235/153 AP |
| 3,962,567 | 8/1976 | Oicles et al. | 235/92 EA |
| 3,984,667 | 10/1976 | Loshbough | 235/151.33 |
| 4,008,405 | 2/1977 | Neumann et al. | 307/231 |
| 4,028,560 | 6/1977 | Bainter | 307/247 A |
| 4,109,141 | 8/1978 | Sasaki | 235/92 CA |
| 4,158,809 | 6/1979 | Dellamano | 324/99 D |
| 4,198,579 | 5/1980 | Ebihara et al. | 307/247 A |

Primary Examiner—John S. Heyman
Attorney, Agent, or Firm—R. J. Steinmeyer; Robert R. Meads; Gary T. Hampson

[57] ABSTRACT

Apparatus for indicating when an analog or digital input signal remains sufficiently stable for a predetermined length of time. The apparatus continuously monitors the input signal instead of sampling it only at discrete points in time. The apparatus includes a memory which stores the value of the input signal at the time of the most recent occurrence of a reset signal, a comparator which produces the reset signal whenever the input signal differs from the memory signal by an amount greater than that allowed by a predetermined comparison criterion, and a timer for indicating that the input signal is stable when the reset signal has not been produced for a time exceeding the predetermined length of time.

4 Claims, 4 Drawing Figures

SIGNAL STABILITY RECOGNITION

BACKGROUND OF THE INVENTION

1. Field of the Invention

The invention relates to means for indicating whether a signal is fluctuating or stable. Particular embodiments of the invention relate to means for indicating when the output of a measuring instrument has stabilized.

2. Description of the Prior Art

In many measuring instrument applications, the instrument's output reading is of interest only when it has stabilized after an initial settling period. The settling period may be required either because the parameter being measured requires a certain time to stabilize or because the measuring instrument has a slow response time. An example of the former is the measurement of a parameter of a chemical mixture, such as pH, wherein the parameter is of interest only after some chemical reaction has proceeded to completion or has reached an equilibrium point. An example of the latter is a typical pH meter whose output reading requires a noticeable amount of time to asymptotically attain its correct value. Another example is a weighing machine which typically experiences mechanical vibrations for a short time after an object is placed on the machine for weighing.

The need for a means to detect when an instrument reading has stabilized has been recognized for some time. However, previously known means for doing so typically sample the instrument reading at fixed points in time and then test whether successive samples differ from each other. If the instrument reading happens to fluctuate between sampling times, the fluctuations may escape detection, causing the instrument reading to be erroneously identified as stable.

SUMMARY OF THE INVENTION

The present invention is an apparatus for indicating when an input signal remains sufficiently stable for a predetermined length of time.

The present invention may be used to continuously monitor the input signal, instead of sampling the input signal only at discrete points in time as in many prior art designs. The present invention may be adapted to respond to either analog or digital types of input signals, unlike some prior art designs which are compatible with only one of the two signal types.

The apparatus according to the present invention comprises memory means, comparator means, and timing means. In response to the input signal and a reset signal, the memory means produces a memory signal equal to the value of the input signal at the time of the most recent occurrence of the reset signal. The comparator means produces the reset signal when the input signal differs from the memory signal by an amount greater than that allowed by a predetermined comparison criterion. The timing means indicates that the input signal is stable when the reset signal has not been produced for a time exceeding a predetermined length of time.

DESCRIPTION OF THE PREFERRED EMBODIMENTS

Figure 1:
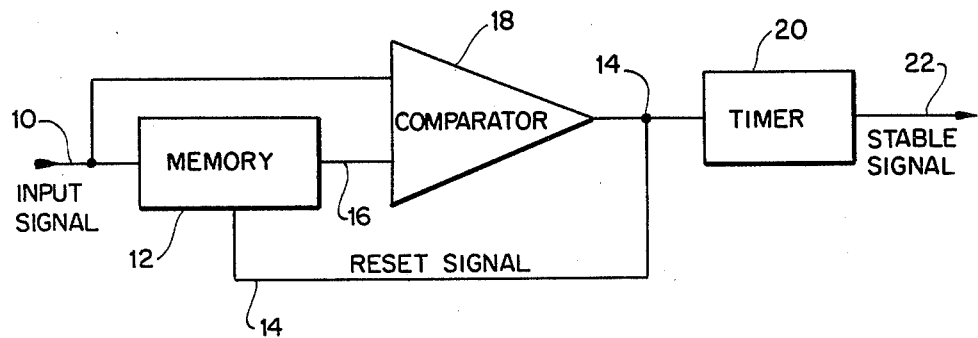
FIG. 1 is a block diagram of an apparatus according to the present invention.

FIG. 1 shows in block diagram form the present invention for indicating the stability of an analog or digital input signal 10.

In operation, memory means 12 receives input signal 10 and a reset signal 14 and produces a memory signal 16. Comparator 18 produces reset signal 14 in accordance with a comparison of memory signal 16 and input signal 10. Timer 20 receives reset signal 14 to determine the stability of input signal 10.

More particularly, memory means 12, in response to input signal 10 and reset signal 14, produces memory signal 16 having a value at any time equal to the value of input signal 10 at the time the reset signal 14 was most recently produced. If input signal 10 is analog, memory means 12 is preferably a sample-and-hold circuit. If input signal 10 is digital, memory means 12 is preferably a digital storage register or latch. In either case, reset signal 14 preferably is applied to a strobe or clock input of the circuit used as the memory means.

Comparator 18 produces the reset signal 14 when input signal 10 differs from memory signal 16 by an amount greater than that allowed by a predetermined comparison criterion designed into the comparator. Comparator 18 may be either analog or digital, according to whether the input and memory signals are analog or digital. In either case, reset signal 14 is preferably a binary signal whose two possible values signify respectively that the reset signal is or is not being "produced".

In the preferred embodiment, the input and memory signals are digital, and the comparison criterion is that reset signal 14 is produced unless input signal 10 is either equal to or one count greater than memory signal 16. This comparison criterion allows digital input signal 10 to be recognized as stable even if it vacillates between two consecutive values.

In operation, each time reset signal 14 is produced, its duration is extremely brief, being approximately equal to the total signal propagation delay through memory means 12 and comparator 18. To understand this, suppose that input signal 10 differs from memory signal 16 by an amount greater than that allowed by the comparison criterion established by comparator 18. After a short propagation delay, comparator 18 will respond to this condition by producing reset signal 14. Upon receiving reset signal 14, memory means 12 will, after a short propagation delay, change memory signal 16 so as to equal input signal 10. At this point, the input and memory signals are equal and hence satisfy the comparison criterion. Therefore, after a short propagation delay, comparator 18 ceases to produce reset signal 14.

Timer 20 produces a "stable" signal 22, which indicates that the input signal 10 is stable, when the reset signal has not been produced for a time exceeding a predetermined length of time "T". The result is that the "stable" signal 22 will be produced if, throughout a time period of duration greater than "T", the input signal remains close enough to its value at the beginning of the time period to continuously satisfy the comparison criterion set by comparator 18.

Figure 2:
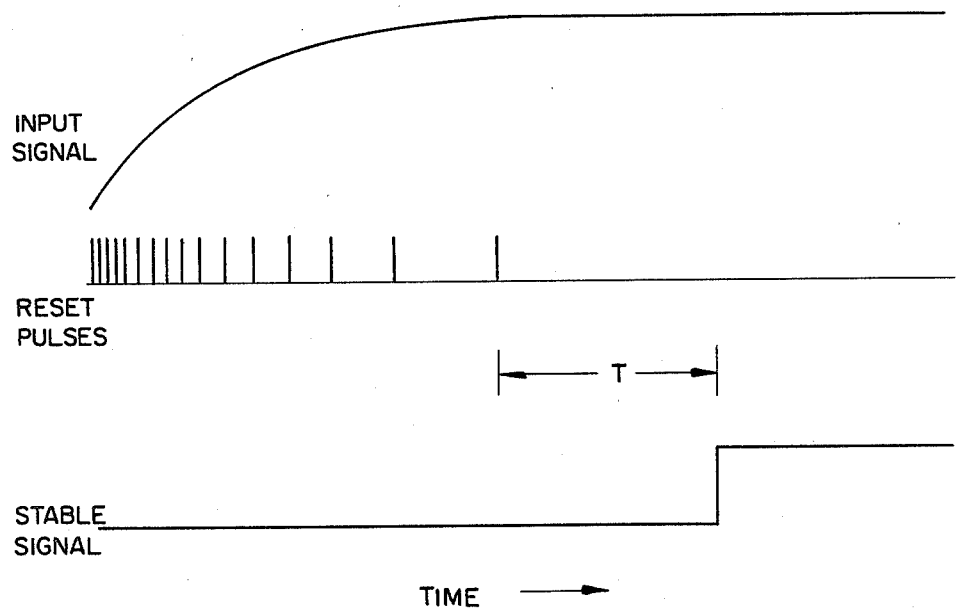
FIG. 2 is a signal timing diagram illustrating the operation of the apparatus of FIG. 1.

FIG. 2 illustrates the operation of the apparatus of FIG. 1 in response to an input signal 10 which asymptotically approaches an ultimate value. A common example of such an input signal is the pH measurement produced by a pH meter, as discussed earlier in the "Background of the Invention".

The uppermost of the three curves in FIG. 2 represents the value of the input signal 10 as a function of time. In the middle curve, each vertical line represents a brief period during which the reset signal 14 is produced. The reset signal consists of very brief pulses, as explained in a preceding paragraph. The lowermost curve depicts the binary "stable" signal 22, shown here as having low and high values to indicate that the input signal is unstable and stable, respectively.

Initially, the input signal is shown as changing fairly rapidly, and therefore the reset pulses are closely spaced in time. Each time a reset pulse 14 is produced, the memory signal 16 is updated to equal the current value of the input signal. The time between successive reset pulses is the time required for the input signal to change from its value at the time of the most recent reset pulse by an amount exceeding the limits of the comparison criterion. As the input signal approaches an ultimate value, the reset pulses become more widely spaced because it takes longer for the input signal to change enough to violate the comparison criterion. Eventually, the input signal changes so little that no more reset pulses are produced. After a time period of length "T" has elapsed with no reset pulses produced, the input signal is recognized as stable, as indicated by the "stable" signal 22 changing from a low to high value.

Figure 3:
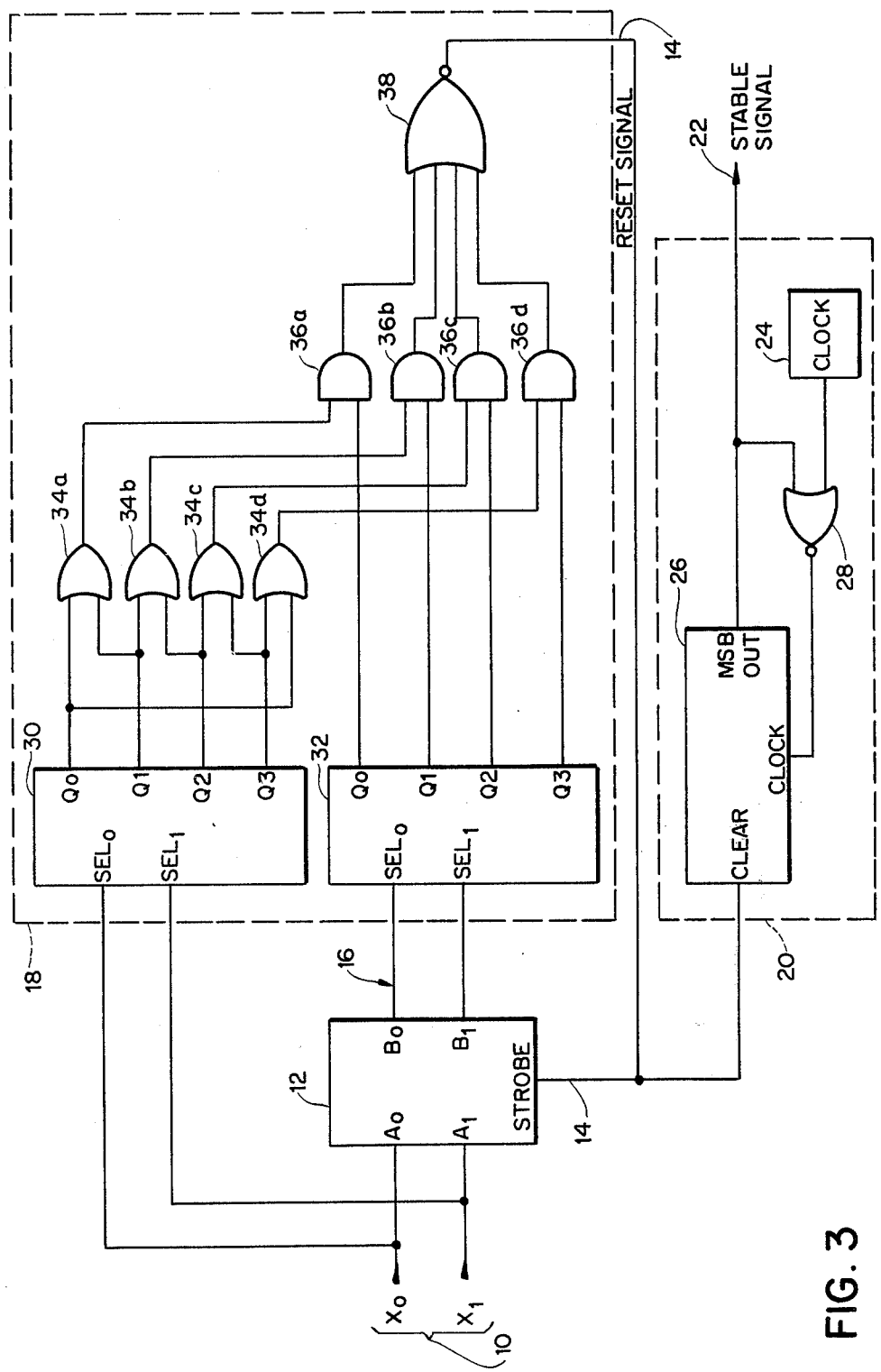
FIG. 3 is a schematic circuit diagram of a preferred embodiment of the invention.

FIG. 3 shows a detailed schematic circuit diagram of the preferred embodiment of the invention. The preferred embodiment comprises the same three building blocks or subsystems as the apparatus shown in FIG. 1: memory 12, comparator 18, and timer 20. Since the operation of these three subsystems is the same as was described in connection with FIG. 1, the following discussion will concentrate on the details of the preferred embodiment not included in the previous description.

In the preferred embodiment, the signal whose stability is to be determined is the binary digital output of an analytical instrument. Input signal 10 consists of two binary bits designated $X_0$ and $X_1$ which connect to the least significant bit and second-least significant bit, respectively, of the binary output of the instrument. Although an instrument output typically consists of several binary bits, it has been found sufficient to use only the two least significant bits as the input signal 10.

The memory means consists of storage register 12 whose strobe input receives the reset signal 14. Storage register 12 has two bits of storage, since the input signal 10 consists of two bits.

Timer 20 comprises a clock 24 driving a binary counter, shown here as 11-bit counter 26. Counter 26 has a "clear" input connected to receive reset signal 14 so that each occurrence of the reset signal resets to zero the count stored in the counter. Clock 24 generates clock pulses, which increment the count stored in counter 26, at intervals equal to 1/1024 of time "T". If no reset pulses are produced during a time of length "T", the counter will attain a count of 1024, thereby setting the most significant bit (MSB) of the counter output. The "stable" signal 22 is obtained from the MSB; therefore, the stable signal is produced if no reset pulses are produced for a time of length "T". NOR gate 28 prevents the counter from continuing to increment after it counts up to 1024.

Comparator 18 establishes the criterion for comparing input signal 10 to memory signal 16. Comparator 18 produces binary reset signal 14 having a value representing a binary "0" when the input signal is close enough to the memory signal to satisfy the comparison criterion. Otherwise, the reset signal has a value representing a binary "1".

Comparator 18 operates as follows. 1-of-4 decoder 30 sets one of its four outputs Q0–Q3 to a binary "1", and the other three to a binary "0", according to the value of the 2-bit input signal 10. Specifically, decoder 30 sets to a binary "1" its Q0, Q1, Q2 and Q3 outputs, respectively, when the binary value of input signal 10 is 00, 01, 10 and 11, which are the respective binary representations of the numbers 0, 1, 2 and 3. Decoder 32 similarly sets to a "1" one of its four outputs Q0–Q3 according to the value of 2-bit memory signal 16.

The comparison criterion is established by OR gates 34a–d, AND gates 36a–d, and NOR gate 38. The comparison criterion is satisfied when input signal 10 is equal to, or one counter greater than, memory signal 16. Under these conditions, the binary reset signal 14 at the output of NOR gate 38 is a "0"; otherwise, it is a "1".

Reset signal 14 is a "0" if any of the four inputs of NOR gate 38 is a "1". The first input of NOR gate 38, from the output of AND gate 36a, is a "1" if memory signal 16 represents the number 0 and input signal 10 represents the number 0 or 1. The second input, from AND gate 36b, is a "1" if memory signal 16 represents the number 1 and input signal 10 represents the number 1 or 2. The third input is a "1" if memory signal 16 represents the number 2 and input signal 10 represents the number 2 or 3. Lastly, the fourth input is a "1" if memory signal 16 represents the number 3 and input signal 10 represents the number 3 or 0. In summary, one of the four inputs of NOR gate 38 will be a "1", and hence reset signal 14 will be a "0", if input signal 10 is equal to, or one count greater than, memory signal 16. Otherwise, reset signal 14 will be a "1".

The preceding discussion explains the operation of the circuitry within comparator 18. The overall system, comprising comparator 18, memory 12 and timer 20, operates just as described earlier in connection with FIG. 1. To reiterate, memory 12 stores the value of input signal 10 at the time reset signal 14 was most recently produced. Comparator 18 continuously compares the current value of input signal 10 with the value stored in memory 12 and produces a reset pulse whenever the input signal assumes a value less than the memory signal 16 or greater than the memory signal plus one. If a predetermined time "T" elapses without any reset pulses being produced, timer 20 produces a "stable" signal to indicate that input signal 10 has satisfied the criteria for recognition as stable. If input signal 10 subsequently begins to fluctuate, comparator 18 produces a reset pulse which resets timer 20, clears the "stable" signal, and restarts the entire process.

The preferred comparison criterion, as discussed, allows input signal 10 to be one count greater than, but not one count less than, memory signal 16. This criterion allows the input signal to vacillate between two consecutive values and still to be recognized as stable. The lower of the two values will be the one stored in memory 12. If the comparison criterion were symmetrical and allowed a plus or minus one count difference, the input signal could wander among three different values and still be indicated as being stable.

In the discussion of FIG. 3, input signal 10 was identified as the two least significant bits of a binary output of a measuring instrument. However, the digital output of an instrument is commonly encoded in binary-coded-decimal (BCD) form instead of pure binary form. Table 1 compares the 5-bit binary representation to the 2-digit BCD representation of the decimal numbers from 0 to 21.

Figure 4:
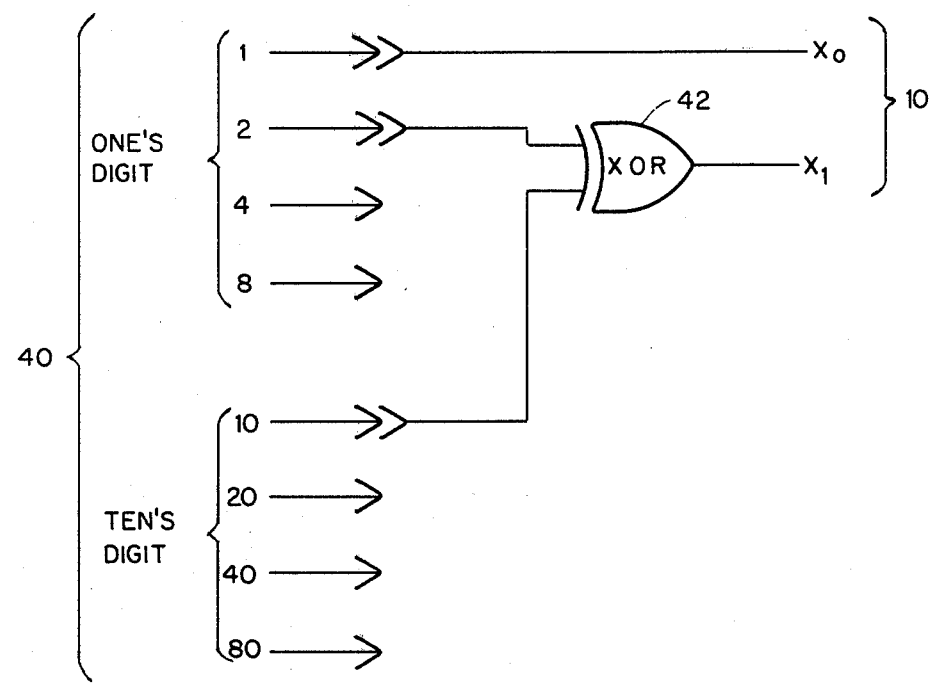
FIG. 4 is a schematic circuit diagram of a BCD-to-binary converter circuit suitable for use with the embodiment of FIG. 3.

FIG. 4 shows the preferred embodiment of a BCD-to-binary converter circuit for producing a 2-bit binary input signal 10 for the circuit of FIG. 3 from a BCD digital signal 40. The BCD signal may consist of several digits, but the converter circuit only requires connection to the two least significant digits, i.e., the ones and tens digits. Each digit consists of four bits; the ones digit consists of four bits representing the values 1, 2, 4 and 8, respectively, and the tens digit consists of four bits representing the values 10, 20, 40 and 80, respectively.

The $X_0$ bit of input signal 10 connects directly to the "1" bit of BCD signal 40. The $X_1$ bit of input signal 10 connects to the output of exclusive OR gate 42, whose two inputs connect to the "2" bit and the "10" bit of BCD signal 40. Table 1 shows that when $X_0$ and $X_1$ are produced by the converter circuit of FIG. 4, each possible value of BCD signal 40 produces $X_0$ and $X_1$ values equal to the two least significant bits of the corresponding binary number. Therefore, the circuit of FIG. 4 converts a BCD digital signal 40 into a 2-bit binary signal 10 suitable for use as the input signal to the circuit of FIG. 3.

The embodiment of the invention shown in FIG. 3 also can be used with a measuring instrument whose output is formatted for a conventional seven-segment display. Preferably, the $X_0$ and $X_1$ bits of input signal 10 as shown in FIG. 3 are obtained from the binary signals for segments "e" and "f", respectively, of the least significant digit of the seven-segment output of the measuring instrument. The "e" and "f" segments are the lower and upper segments, respectively, on the left side of the conventional seven-segment array pattern.

Table 2 shows the 2-bit binary value of input signal 10 for each decimal value from zero through nine of the least significant digit of the instrument's seven-segment output. Except for the sequence 3-4-5, a one count change in the decimal value of the seven-segment digit changes input signal 10 by one count. More significantly, the seven-segment digit can change by at most two counts without changing input signal 10 by more than one count. Therefore, the circuit of FIG. 3 will recognize the seven-segment instrument output as stable only if it fluctuates among no more than three consecutive decimal values.

TABLE 1

| DECIMAL | 2-DIGIT BCD | 5-BIT BINARY | $X_1$ | $X_0$ |
|---|---|---|---|---|
| 0 | 0000 0000 | 00000 | 0 | 0 |
| 1 | 0000 0001 | 00001 | 0 | 1 |
| 2 | 0000 0010 | 00010 | 1 | 0 |
| 3 | 0000 0011 | 00011 | 1 | 1 |
| 4 | 0000 0100 | 00100 | 0 | 0 |
| 5 | 0000 0101 | 00101 | 0 | 1 |
| 6 | 0000 0110 | 00110 | 1 | 0 |
| 7 | 0000 0111 | 00111 | 1 | 1 |
| 8 | 0000 1000 | 01000 | 0 | 0 |
| 9 | 0000 1001 | 01001 | 0 | 1 |
| 10 | 0001 0000 | 01010 | 1 | 0 |
| 11 | 0001 0001 | 01011 | 1 | 1 |
| 12 | 0001 0010 | 01100 | 0 | 0 |
| 13 | 0001 0011 | 01101 | 0 | 1 |
| 14 | 0001 0100 | 01110 | 1 | 0 |
| 15 | 0001 0101 | 01111 | 1 | 1 |
| 16 | 0001 0110 | 10000 | 0 | 0 |
| 17 | 0001 0111 | 10001 | 0 | 1 |
| 18 | 0001 1000 | 10010 | 1 | 0 |
| 19 | 0001 1001 | 10011 | 1 | 1 |
| 20 | 0010 0000 | 10100 | 0 | 0 |
| 21 | 0010 0001 | 10101 | 0 | 1 |

TABLE 2

| 7-SEGMENT DIGIT | 2-BIT BINARY INPUT SIGNAL |
|---|---|
| 0 | 11 |
| 1 | 00 |
| 2 | 01 |
| 3 | 00 |
| 4 | 10 |
| 5 | 10 |
| 6 | 11 |
| 7 | 00 |
| 8 | 11 |
| 9 | 10 |

I claim:

1. Apparatus for indicating when an input signal remains sufficiently stable for a predetermined length of time, comprising:

memory means, responsive to the input signal and a reset signal, for producing a memory signal equal to the value of the input signal at the time of the most recent occurrence of the reset signal;

comparator means responsive to the memory signal and to the input signal for producing the reset signal when the input signal differs from the memory signal by an amount greater than that allowed by a predetermined comparison criterion; and resettable timing means responsive to the reset signal for indicating that the input signal is stable by generating a signal only when the reset signal has not been produced for a time exceeding the predetermined length of time.

2. Apparatus according to claim 1, wherein
the input signal and the memory signal are each analog signals; and
the memory means comprises a sample-and-hold circuit.

3. Apparatus according to claim 1, wherein
the input signal and the memory signal are each digital signals;
the memory means includes a storage register; and
the comparator means produces the reset signal unless the input signal is equal to the memory signal or is within a predetermined number of counts of the memory signal.

4. Apparatus for indicating when a digital input signal remains sufficiently stable for a predetermined length of time, comprising:

memory means, responsive to the digital input signal and to a reset signal, for producing a digital signal equal to the value of the digital input signal at the time of the reception of the reset signal by the memory means;

comparator means including means for determining when the difference between the digital input signal and the digital memory signal exceeds a predetermined number of binary counts, and means for generating the reset signal when the difference exceeds the predetermined number of binary counts; and resettable timing means for generating a signal only when the reset signal has not been produced for a time exceeding the predetermined length of time to thereby indicate that the input signal is sufficiently stable.

* * * * *